United States Patent [19]
Powell

[11] Patent Number: 4,751,407
[45] Date of Patent: Jun. 14, 1988

[54] SELF-TIMING CIRCUIT

[75] Inventor: Scott R. Powell, Carlsbad, Calif.

[73] Assignee: Hughes Aircraft Company, Los Angeles, Calif.

[21] Appl. No.: 943,353

[22] Filed: Dec. 19, 1986

[51] Int. Cl.[4] .................... H03K 19/00; H03K 19/096
[52] U.S. Cl. .................................... 307/480; 307/481; 307/451; 307/452; 307/269
[58] Field of Search ............... 307/451, 452, 453, 480, 307/481, 468, 269

[56] References Cited

U.S. PATENT DOCUMENTS

| | | | |
|---|---|---|---|
| 4,040,015 | 8/1977 | Fukuda | 340/173 R |
| 4,569,032 | 2/1986 | Lee | 364/787 |
| 4,570,083 | 2/1986 | Nakaizumi | 307/443 |
| 4,617,480 | 10/1986 | Au | 307/480 |

OTHER PUBLICATIONS

"Receiver for Clocked or Pseudo-Clocked Cascode Voltage Switch Logic", IBM Technical Disclosure Bulletin, by Miersch et al., vol. 27, No. 10B, Mar. 1985.

Primary Examiner—Stanley D. Miller
Assistant Examiner—Richard Roseen
Attorney, Agent, or Firm—Kenneth W. Float; A. W. Karambelas

[57] ABSTRACT

A timing circuit is disclosed for use with an external circuit that provides a precharge/evaluation complete signal indicative of precharge completion and evaluation completion. The timing circuit is responsive to a clock signal and the precharge/evaluation complete signal provided by the external circuit, and includes a clock enabling circuit responsive to the clock signal and the precharge/evaluation complete signal for providing a clock enable signal having first and second states respectively indicative of (a) a predetermined condition wherein evaluation has been completed and the clock signal is at a predetermined level, and (b) precharge completion. A level shifting circuit is responsive to the clock signal and the clock enable signal and provides a phase control signal to the pseudo CMOS circuit, where such phase control signal defines (a) a precharge phase in response to said clock enable signal indicating the predetermined condition and the clock signal providing a predetermined transition, and (b) an evaluation phase in response to the precharge/evaluation complete signal indicating completion of precharging. A latching circuit is responsive to the clock enable signal and the clock signal for selectively latching the phase control signal in its respective phases.

9 Claims, 3 Drawing Sheets

SELF-TIMING CIRCUIT

BACKGROUND OF THE INVENTION

The disclosed invention generally relates to timing circuitry, and more particularly relates to self-timed clocking circuitry for metal oxide semiconductor (MOS) logic circuitry known as pseudo complementary metal oxide semiconductor (CMOS) logic.

Standard or classical CMOS logic is characterized by complementary symmetry about a gate output and generally includes one p-channel transistor for each n-channel transistor. An important advantage of CMOS logic is low power consumption. However, known disadvantages of standard CMOS logic include layout complexity, and larger areas required for p-channel transistors. Further, standard CMOS logic design requires a complementary series transistor for each parallel transistor, which may result in slower performance.

Efforts have been made to develop logic circuits which avoid the disadvantage of standard CMOS logic while maintaining low power consumption. For example, "domino CMOS", also known as pseudo CMOS, utilizes primarily n-channel transistors and achieves reduced layout complexity, reduced gate areas, and faster performance. For discussions of pseudo CMOS see "High-Speed Compact Circuits with CMOS," Krambeck et al, *IEEE Journal of Solidstate Circuits*, Vol. SC-17, No. 3, pages 614-619, June 1982; and "An Introduction to CMOS Design Styles," *VLSI Design*, Vol. 5, No. 9, pages 88-96, September 1984.

However, pseudo CMOS requires additional timing phases for defining (a) a precharge phase when the output of a logic gate is precharged to a high state and during which changing of inputs to the logic gate occurs, and (b) an evaluation phase during which the output of the logic gate changes pursuant to its inputs. A single clock signal may be utilized for defining the precharge phase and the evaluation phase, where for example the positive going clock transition starts the precharge phase and terminates the evaluation phase, and the negative going clock transition starts the evaluation phase and terminates the precharge phase.

The clock phases for the precharge and evaluation phases are in addition to the standard clock phases for latching data inputs and latching data outputs. Thus, pseudo CMOS designs may utilize up to four separate clock phases. In terms of VLSI implementations, the use of up to four separate clock phases and maintaining a fixed phase relationship between all clock phases may present some difficulties. Further, the use of fixed phase clocks requires the same fixed operational delays for all pseudo CMOS circuits on a chip regardless of the capabilities of individual circuits. Such use of common fixed phase clocks for all pseudo CMOS circuits on a chip requires determination of the greatest delays and adding a safety margin.

One known approach for providing the precharge and evaluation clock phases for individual pseudo CMOS circuits utilizes a monostable multivibrator (a one-shot) to provide a pulse in response to a predetermined edge of a clock signal that is common to all the one-shots for the pseudo CMOS circuits on a chip. For this approach to be successful, the delay of each pseudo CMOS circuit must be determined by extensive circuit simulations since direct measurements are generally not possible. Further, the pulsewidth of a one-shot is determined by an RC time constant, and process variations affect both resistive and capacitive elements. Thus, large margins have to be designed into the use of one-shots for respective pseudo CMOS circuits.

SUMMARY OF THE INVENTION

It would therefore be an advantage to provide a timing circuit for pseudo CMOS logic which does not utilize a global fixed phase between precharge and evaluation clock signals.

Another advantage would be to provide a timing circuit for each pseudo CMOS logic circuit in an integrated circuit chip which is static and does not utilize respective one-shots for each pseudo CMOS circuit in an integrated circuit chip, but which retains the duty cycle independence of a one-shot.

It would also be an advantage to provide a timing circuit for each pseudo CMOS logic circuit in an integrated circuit chip which matches clock phasing to the performance characteristics of its corresponding pseudo CMOS circuit.

A further advantage would be to provide a timing circuit for an external circuit which optimizes the operating speed of such external circuit.

The foregoing and other advantages and features are provided by the timing circuit of the invention which is utilized with an external circuit that provides a precharge/evaluation complete signal indicative of precharge completion and evaluation completion. The timing circuit is responsive to a clock signal and the precharge/evaluation complete signal provided by the external circuit, and includes a clock enabling circuit responsive to the clock signal and the precharge/evaluation complete signal for providing a clock enable signal having first and second states respectively indicative of (a) a predetermined condition wherein evaluation has been completed and the clock signal is at a predetermined level, and (b) precharge completion. A level shifting circuit is responsive to the clock signal and the clock enable signal and provides a phase control signal to the pseudo CMOS circuit, where such phase control signal defines (a) a precharge phase in response to said clock enable signal signal providing a predetermined transition, and (b) an evaluation phase in response to the precharge/evaluation complete signal indicating completion of precharging. A latching circuit is responsive to the clock enable signal and the clock signal for selectively latching the phase control signal in its respective phases.

The self-timing circuit of the invention converts a single phase clock signal into a clock signal having four distinct phases. These are the input latch phase, precharge phase, evaluate phase and output latch phase. The circuit is static, edge triggered and operates independently of the frequency and duty cycle of the single phase clock.

This circuit of the invention allows pseudo-CMOS circuits to be integrated with traditional single phase synchronous or asynchronous static CMOS circuit designs. The circuit design reduces a complex logic design which commonly requires two levels of combinational logic gates and a flip-flop which produces a three-gate delay into a circuit having a single-gate delay.

The self-timing circuit of the invention presets itself into a known state so that external initialization is not required. In particular, although twenty-six (26) transistors are used to implement the self-timing circuit in the embodiment disclosed, the primary circuit output is driven by only three transistors under direct control of the inputs, thus yielding a one-gate signal delay between the inputs and the primary output.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
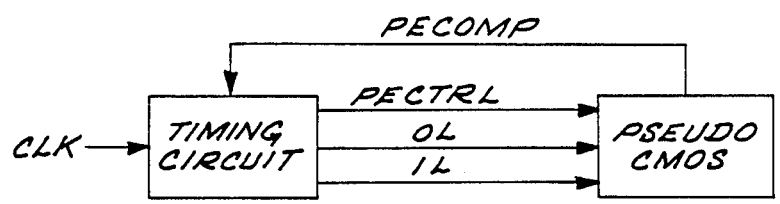
FIG. 1 is a block diagram illustrating the use of the timing circuit of the invention.

In the following detailed description and in the several figures of the drawing, like elements are identified with like reference numerals.

The disclosed invention relates to timing phases for pseudo CMOS and related circuits. Therefore, the well known terms "precharge" and "evaluation" are utilized in respective reference to (a) the precharge phase when the output of the pseudo CMOS circuit being clocked is precharged to a predetermined state such as the high state, and (b) the evaluation phase when the output of the pseudo CMOS circuit changes in response to the inputs provided during the precharge phase.

Referring now to FIG. 1, shown therein is a block diagram illustrating the use of the disclosed timing circuit 10 with a corresponding pseudo CMOS circuit 110, which by way of example may be a programmable logic array (PLA). It is contemplated that each pseudo CMOS circuit in an integrated circuit has a corresponding timing circuit.

The timing circuit 10 of the invention provides the following signals to the pseudo CMOS circuit 110: a precharge/evaluation control signal PECTRL, an input latch signal IL, and an output latch signal OL. The timing circuit receives a clock signal CLK from a clocking signal source (not shown) and further receives a precharge/evaluation complete signal PECOMP from the pseudo CMOS circuit 110. These input and output timing signals are more particularly defined below.

The Timing Signals

The clock signal CLK is an input clock signal which, for example, may be the master clock signal for the very large scale integrated (VLSI) circuit which incorporates the timing circuit 10. As a further example, the clock signal CLK may be a data ready signal in an asynchronous application.

The input precharge/evaluation complete signal PECOMP is an input signal which is received from the pseudo CMOS circuit 110 that is being clocked by the timing circuit 10. The precharge/evaluation complete signal PECOMP indicates completion of the respective precharge and evaluation functions of the clocked pseudo CMOS circuit.

The precharge/evaluation complete signal PECOMP is provided by structure in the pseudo CMOS circuit 110 which provides a positive going transition pursuant to completion of the circuit response to the precharge phase and provides a negative going transition pursuant to completion of the circuit response to the evaluation phase. By way of example, the precharge/evaluation complete signal PECOMP may be provided by a "dummy" output of a pseudo CMOS programmable logic array (PLA). Such dummy output would be provided by structure that includes (a) a "dummy" product term provided by the AND plane which is based on all of the inputs to the PLA, and (b) a "dummy" output of the OR plane which is based on all of the product terms provided to the OR plane, including the "dummy" product term. Such "dummy" output of the OR plane would be the "dummy" output of the PLA and would provide the worst case delay path for the PLA.

The precharge/evaluation control signal PECTRL provides the precharge and evaluation clock phases to the pseudo CMOS circuit 110 being clocked by the timing circuit 10.

The input latch signal IL is generated by the timing circuit 10 to indicate that the inputs to the pseudo CMOS circuit 110 being clocked may latched.

The output latch signal OL is generated by the timing circuit 10 to indicate that the outputs of the pseudo CMOS circuit 110 being clocked may be latched.

The Timing Circuit

Figure 2:
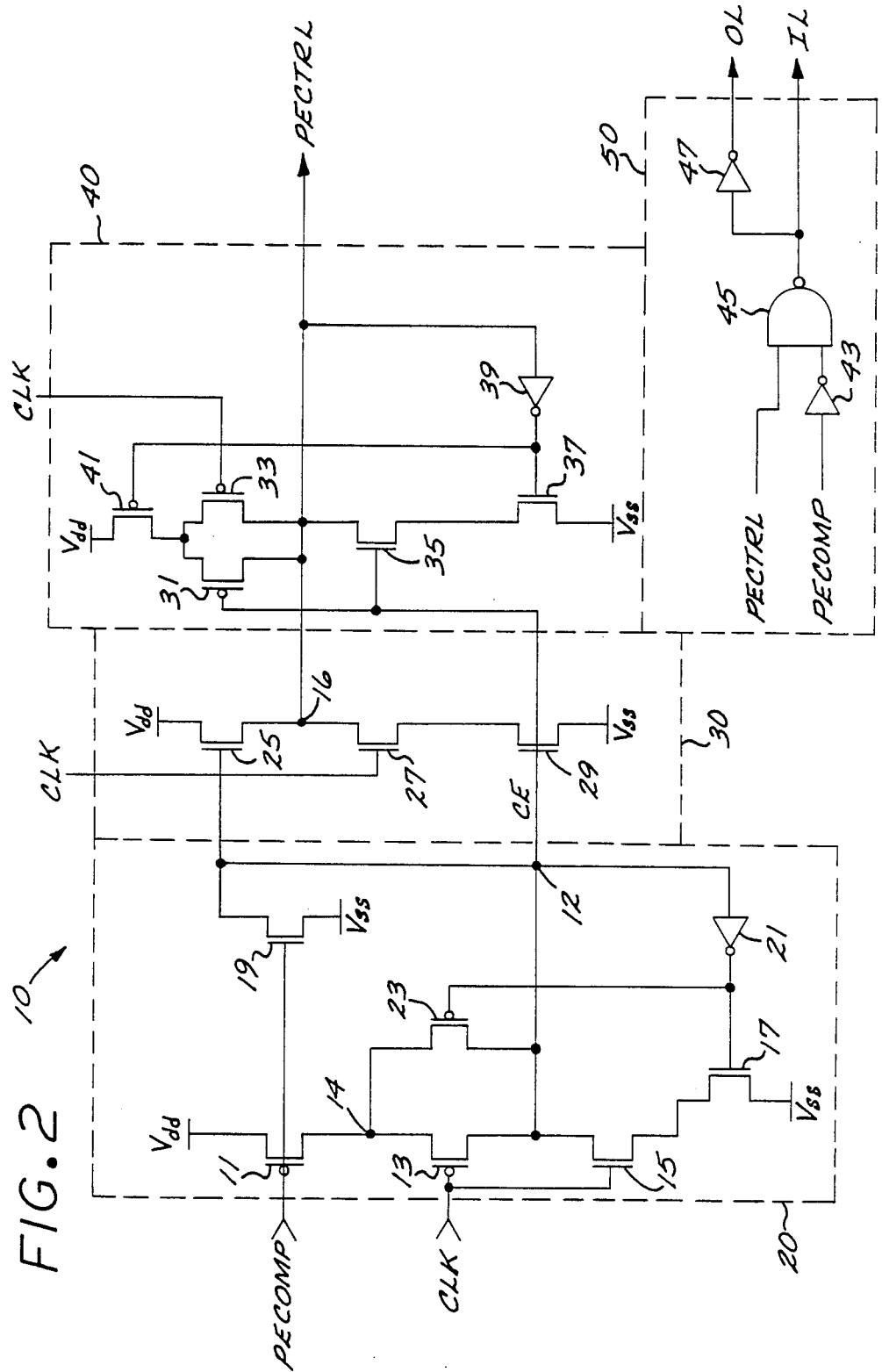
FIG. 2 is a circuit schematic of the timing circuit of the invention.

Referring now to FIG. 2, shown therein is a circuit schematic of the timing circuit 10 which generally includes a clock enable circuit 20, a pull up/down circuit 30, a precharge latch 40, and a data input/output (I/O) latch signal generator 50. The clock enable circuit 20 is responsive to the clock signal CLK and the precharge/evaluation complete signal PECOMP. The pull up/down circuit 30 shifts the level of the precharge/evaluation control signal PECTRL signal to define the precharge and evaluation phases in response to the clock signal CLK and the clock enable circuit 20.

The precharge latch 40 is responsive to the clock signal CLK, the clock enable circuit 20, and the pull up/down circuit 30, and functions to latch the precharge/evaluation control signal PECTRL so it does not float. The data I/O latch signal generator 50 is responsive to the precharge/evaluation control signal PECTRL and the precharge/evaluation complete signal PECOMP, and generates the input latch signal IL and the output latch signal OL which are utilized for controlling the latching of the inputs and outputs of the pseudo CMOS circuit being clocked.

The clock enable circuit 20 specifically includes a p-channel transistor 11 which has the precharge/evaluation complete signal PECOMP provided to its gate. The source of the p-channel transistor 11 is coupled to a reference voltage $V_{dd}$ and the drain of the p-channel transistor 11 is coupled to the source of another p-channel transistor 13. The gate of the p-channel transistor 13 receives the clock signal CLK, while its drain is coupled to the drain of an n-channel transistor 15 which has its gate coupled to the clock signal CLK. The source of the n-channel transistor 15 is coupled to the drain of an n-channel transistor 17 which has its source coupled to a further reference voltage $V_{ss}$ which is less than the reference voltage $V_{dd}$.

The clock enable circuit 20 further includes an n-channel transistor 19 which receives the precharge/evaluation complete signal PECOMP at its gate and has its source coupled to the reference voltage $V_{ss}$. The drain of the n-channel transistor 19 is coupled to the node 12 between the drain of the p-channel transistor 13 and the drain of the n-channel transistor 15. The drain of the p-channel transistor 19 is also provided as the input to an inverter 21 which has its output coupled to the gate of the n-channel transistor 17.

The output of the inverter 21 is further coupled to the gate of a p-channel transistor 23 which has its source coupled to the node 14 between the drain the p-channel transistor 11 and the source of the p-channel transistor 13. The drain of the p-channel transistor 23 is coupled to the node 12. The signal at the node 12 is identified as the clock enable signal CE which, as discussed further herein enables the pull up/down circuit 30 to directly control the percharge/evaluation control signal PECTRL pursuant to the clock signal CLK.

The pull up/down circuit 30 includes a p-channel transistor 25 which has its gate coupled to the clock enable signal provided at the node 12. The source of the p-channel transistor 25 is coupled to the reference voltage $V_{dd}$ while its drain is coupled to the drain of an n-channel transistor 27 at a node 16. The clock signal CLK is provided to the gate of the n-channel transistor 27 which has its source coupled to the drain of an n-channel transistor 29. The gate of the n-channel transistor 29 receives the clock enable signal CE provided at the node 12 of the clock enable circuit 20. The source of the n-channel transistor 29 is coupled to the reference voltage $V_{ss}$. Briefly, the transistors 25, 27, 29 are serially coupled between the reference voltage $V_{dd}$ and the reference voltage $V_{ss}$.

The precharge latch circuit 40 includes a p-channel transistorb 31 which has its gate coupled to the node 12 and therefore receives the clock enable signal CE. The source and drain of the p-channel transistor 31 are respectively coupled to the source and drain of another p-channel transistor 33. The gate of the p-channel transistor 33 receives the clock signal CLK. The drains of the p-channel transistors 31, 33 are coupled to the node 16 between the p-channel transistor 25 and the n-channel transistor 37. The drain of an n-channel transistor 35 is also coupled to the node 16 which provides the precharge/evaluation control signal PECTRL. The gate of the n-channel transistor 35 is coupled to the node 12 and receives the clock enable signal CE, and its source is coupled to the drain of an n-channel transistor 37. The source of the n-channel transistor 37 is coupled to the reference voltage $V_{ss}$.

The node 16, which provides the precharge/evaluation signal PECTRL, is further coupled to the input of an inverter 39. The output of the inverter 39 is coupled to the gate of the n-channel transistor 37 and is further coupled to the gate of a p-channel transistor 41. The source of the p-channel transistor 41 is coupled to the reference voltage $V_{dd}$ and its drain is coupled to the sources of the p-channel transistors 31, 33.

The data I/O latch signal generator 50 includes an inverter 43 which receives the precharge/evaluation complete signal PECOMP and which provides its output to a two input NAND gate 45. The other input to the NAND gate 45 is provided by the precharge/evaluation control signal PECTRL. The output of the NAND gate 45 is further coupled to the input of an inverter 47 which provides the output data latch signal OL.

Steady State Operation

Figure 3:
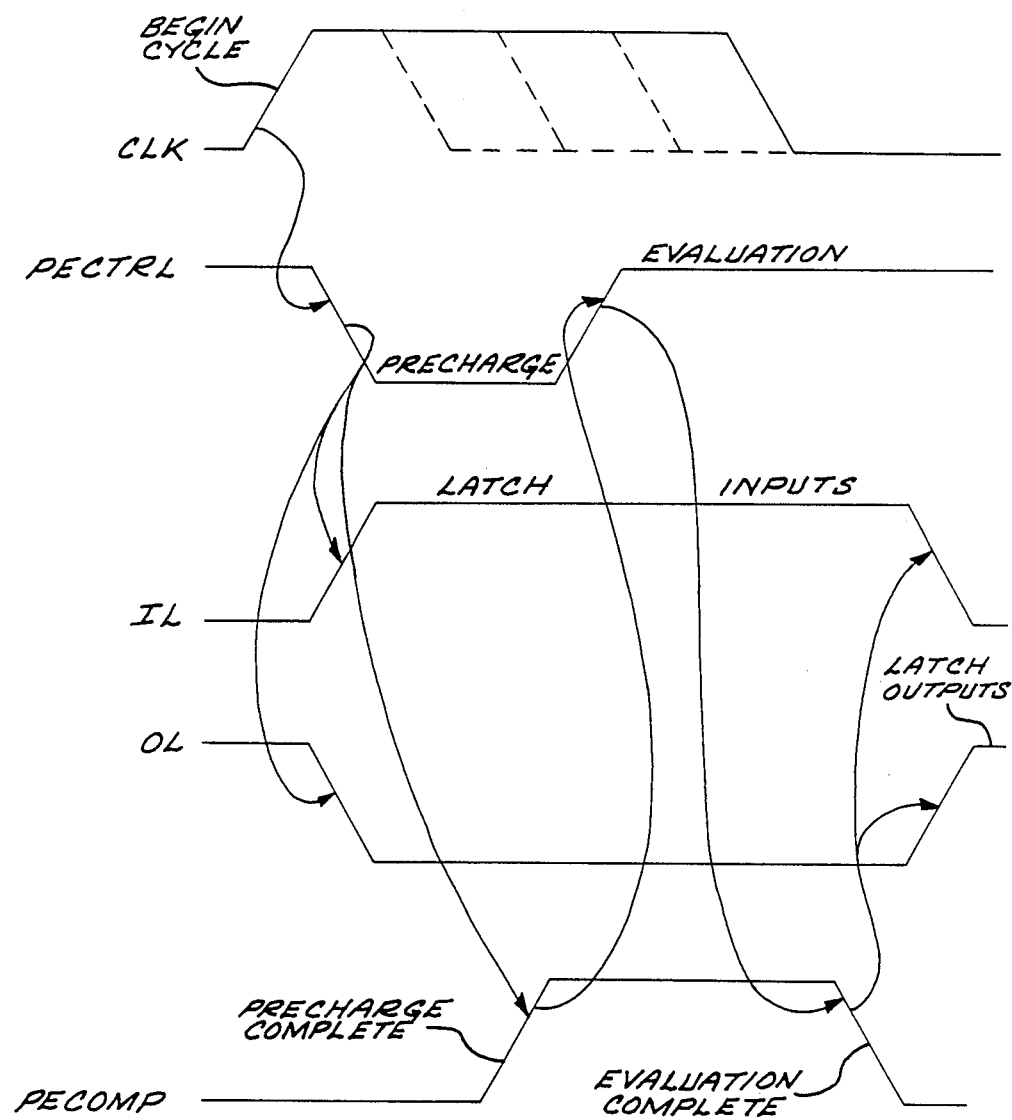
FIG. 3 is a timing diagram illustrating the timing relationships between certain inputs and outputs of the timing circuit of FIG. 2.

Referring now to FIG. 3, the clocking provided by the timing circuit 10 will be discussed relative to the steady state operation wherein the timing circuit 10 is in the following state prior to a positive going transition of the clock signal CLK. The precharge/evaluation complete signal PECOMP is low, the clock enable signal CE at the node 12 is latched high, the precharge/evaluation control signal PECTRL is latched high, the input data latch signal IL is low, and the output data latch signal is high. The negative going transition of the precharge/evaluation complete signal PECOMP that caused the signal PECOMP to be low indicates that evaluation is complete. As will be discussed further herein, the timing circuit 10 will provide such steady state conditions without any necessary initialization.

The clock enable signal CE at the node 12 is latched high and therefore the inverter 21 provides a low output. As a result of the low output of the inverter 21, the transistor 17 is off and the transistor 23 is on. Since the precharge/evaluation complete signal PECOMP is low, the transistor 11 is on and the transistors 19, 25 are off. Since the clock enable signal CE at the node 12 is high, the transistors 29, 35 are on and the transistors 25, 31 are off. The clock signal CLK is low and therefore the transistors 13, 33 are on while the transistors 15, 27 are off. The precharge/evaluation control signal PECTRL at the node 16 is high and therefore the input to the inverter 39 is high, which results in an inverter output that is low. As a result of the low output of the inverter 39, the transistor 41 is on and the transistor 37 is off. The transistors 33, 41 are on and therefore latch the precharge/evaluation control signal PECTRL high.

When the clock signal CLK provides a positive going transition to begin a cycle, the transistors 15, 27 turn on and the transistors 13, 33 turn off. The precharge/evaluation control signal PECTRL at the node 16 is therefore pulled low. When the control signal PECTRL is pulled low, the output of the inverter 39 goes high and the transistor 37 turns on. The clock enable signal CE remains latched high, and the precharge/evaluation control signal PECTRL is now ready to be controlled pursuant to a positive going transition of the precharge/evaluation complete signal PECOMP. The low state of the control signal PECTRL defines the precharge phase for the pseudo CMOS circuit being clocked.

When the precharge evaluation control signal PECTRL is pulled low, the input latch signal IL transitions to high since the precharge/evaluation complete signal PECOMP is low. The output latch signal OL, which is the inverse of the input latch signal, transitions to low.

After the precharge/evaluation control signal PECTRL transitions low, it is latched low until the precharge/evaluation complete signal PECOMP transitions high regardless of occurrence of a negative going clock transition. Such a negative going transition of the clock signal CLK would cause the transistors 13, 33 to turn on and the transistors 15, 27 to turn off. However, the transistors 35, 37 would remain on, thereby keeping the precharge/evaluation control signal PECTRL low.

The precharge/evaluation complete signal PECOMP from the pseudo CMOS circuit 110 provides a positive going transition to indicate that precharging is complete. Pursuant to such positive going transition, the transistor 11 turns off, the transistor 19 turns on, and the clock enable signal CE at the node 12 is pulled low. The inverter 21 provides a high output, the transistor 17 turns on, and the transistor 23 turns off. The clock enable signal CE at the node 12 is therefore pulled low, and will remain low until the precharge/evaluation complete signal PECOMP and the clock signal CLK are both low.

As a result of the clock enable signal CE at node 12 being pulled low, the transistors 25, 31 turn on, and the transistors 29, 35 turn off. The precharge/evaluation control signal PECTRL at the node 16 therefore transitions high and the inverter 39 provides a low output. As a result of this low output, the transistor 37 turns off and the transistor 41 turns on.

The precharge/evaluation control signal PECTRL at the node 16 remains high until such time as the precharge/evaluation signal PECOMP is low (which causes the clock enable signal CE to be pulled high) and the clock signal CLK provides a positive going transition. The high state of the precharge/evaluation control signal PECTRL defines the evaluation phase for the pseudo CMOS circuit 110 being clocked by the timing circuit 10.

The precharge/evaluation complete signal PECOMP provided by the pseudo CMOS circuit 110 provides a negative going transition to indicate that evaluation is complete. Because the precharge/evaluation complete signal PECOMP provides a negative going transition, the input latch signal IL is pulled low, and the output latch signal OL is pulled high. Further as a result of the negative going transition of the precharge/evaluation complete signal PECOMP, the transistor 11 turns on, and the transistor 19 turns off. The state of the precharge/evaluation control signal PECTRL will be controlled by the next positive going transition of the clock signal CLK. In other words, regardless of the state of the clock signal CLK when the precharge/evaluation complete signal PECOMP provides a negative going transition, the control signal PECTRL is latched high until the next positive going transition of the clock signal CLK.

The fact that the precharge/evaluation control signal PECTRL is latched high until the next positive going transition of the clock signal CLK can be better understood from a consideration of the two possible states of the clock signal CLK when the precharge/evaluation complete signal PECOMP provides a negative transition. If the clock signal CLK is low, the transistors 13, 33 are on, and the transistors 15, 27 are off. The clock enable signal CE at the node 12 is therefore pulled high when the precharge/evaluation complete signal PECOMP transitions low. Since the clock enable signal CE at the node 12 is pulled high, the output of the inverter 21 is pulled low, thereby causing the transistor 17 to turn off and the transistor 23 to turn on. The clock enable signal CE is therefore latched high so long as the precharge/evaluation complete signal PECOMP remains low, regardless of the state of the clock signal CLK.

Because the clock enable signal CE at the node 12 is pulled high, the transistors 25, 31 turn off, and the transistors 29, 35 turn on. The precharge/evaluation control signal PECTRL at the node 16 therefore remains high pursuant to conduction by the transistors 33, 41. The clock enable signal CE is latched high, and therefore the next positive going transition of the clock signal CLK will cause the precharge/evaluation signal PECTRL to make a negative going transition since the transistor 27 will turn on when the clock signal CLK goes high.

If the clock signal CLK is high when the precharge/evaluation complete signal PECOMP provides a negative going transition, the transistors 15, 27 are on, and the transistors 13, 33 are off. When the precharge/evaluation complete signal PECOMP transitions low, the transistor 11 turns on, and the transistor 19 turns off. Since the transistor 15 is on and the transistor 17 is on (as a result of the clock enable signal CE at the node 12 being low prior to the negative transition of the precharge/evaluation complete signal PECOMP), the clock enable signal CE at the node 12 remains low. The precharge/evaluation control signal PECTRL remains high since both the transistors 31, 41 are on.

Continuing with the condition where the clock signal CLK is high when the precharge/evaluation complete signal provides a negative transition, when the clock signal CLK provides a negative going transition, the transistors 13, 33 turn on, and the transistors 15, 27 turn off. The clock enable signal CE is pulled high, and the precharge/evaluation control signal PECTRL remains high.

Thus, after the precharge/evaluation complete signal PECOMP provides a negative going transition, the timing circuit 10 responds to the next positive going transition of the clock signal CLK as described previously, starting with the precharge/evaluation complete signal PECTRL providing a negative going transition.

Briefly stated, the clock enable signal CE at the node 12 determines which signal controls the precharge/evaluation control signal PECTRL at the node 16. When the clock enable signal CE at the node 12 is high, a positive going transition of the clock signal CLK directly controls the negative going transition of the precharge/evaluation control signal PECTRL via the transistor 27. As discussed above, the clock enable signal CE at the node 12 is pulled high when (a) the precharge/evaluation complete signal provides a negative going transition indicating that evalution is complete while the clock signal CLK is already in the low state, or (b) when the clock signal CLK transitions low after the precharge/evaluation complete signal PECOMP has already transitioned low.

When the clock enable signal CE at the node 12 is low, the clock signal CLK is disabled from controlling the precharge/evaluation control signal PECTRL at the node 16. The precharge/evaluation control signal PECTRL is driven low by the precharge/evaluation complete signal PECOMP going high, which also causes the precharge/evaluation control signal PECTRL to transition high. The clock enable signal CE is held low until one of the above conditions drives it high.

In terms of circuitry, when the clock enable circuit 20 provides a high clock enable signal CE, the pull up/down circuit 30 functions to directly cause the precharge/evaluation control signal PECTRL to provide a negative going transition in response to a positive going transition of the clock signal CLK. This control pursuant to the clock signal CLK results in a negative going transition of the precharge/evaluation control signal PECTRL with minimum delay relative to the positive going transition of the clock signal CLK. When the clock enable circuit 20 provides a low clock enable signal CE pursuant to a positive going transition of the precharge/evaluation complete signal PECOMP, the pull up/down circuit 30 causes the precharge/evaluation control signal PECTRL to provide a positive going transition.

It should be appreciated that while the disclosed timing circuit 10 includes numerous transistors, the precharge/evaluation control signal PECTRL is driven by only the three transistors 25, 27, 29 under the direct control of the clock signal CLK and the precharge/evaluation complete signal PECOMP. Thus, the complex function of providing the phases of the precharge/evaluation control signal PECTRL is implemented with only one gate delay relative to the controlling inputs.

Figure 4A:
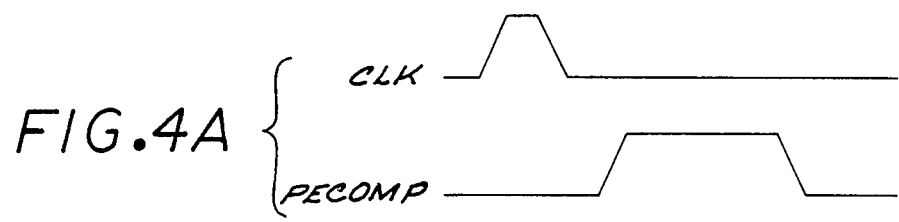
FIGS. 4A through 4C are timing diagrams representing the three possible conditions of the clock phasing provided by the timing circuit of FIG. 2 relative to the primary clock signal that drives the timing circuit.
Figure 4B:
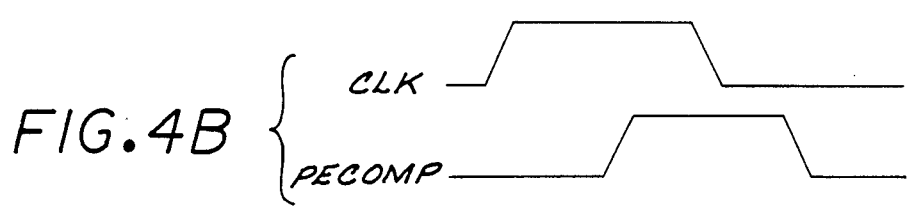
Figure 4C:
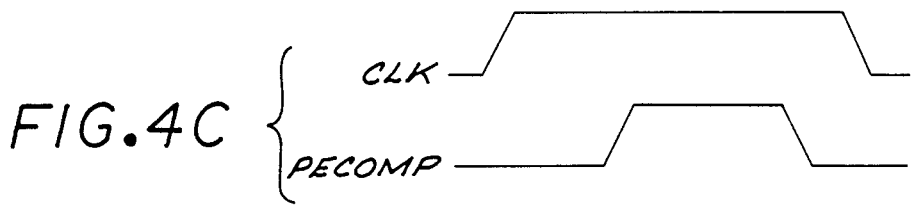

Referring now to FIGS. 4A through 4C, schematically illustrated therein are three possible conditions for the clock signal CLK relative to the precharge/evaluation complete signal PECOMP.

The timing diagram of FIG. 4A illustrates the condition where the positive pulse width of the clock signal is less than the precharge time of the pseudo CMOS circuit 110, during which the precharge/evaluation complete signal PECOMP is low. From the foregoing discussion, it should be recalled that under the condition of the timing diagram of FIG. 4A the clock enable signal CE will have been latched high and the precharge/evaluation control signal PECTRL will have been latched low pursuant to the positive going transition of the clock signal CLK while the precharge/evaluation complete signal PECOMP is low. Thus, the negative going transition of the clock signal CLK prior to a positive transition of the precharge/evaluation complete signal PECOMP does not change the precharge/evaluation control signal PECTRL. It should be noted that in the event the next positive pulse of the clock signal CLK occurs prior to the next positive going transition of the precharge/evaluation complete signal PECOMP, such pulse will not affect the operation of the timing circuit 10. Only a positive going transition the clock signal CLK subsequent to a negative going transition of the precharge/evaluation complete signal PECOMP provides for the negative going transition of the precharge/evaluation control signal PECTRL.

The timing diagram of FIG. 4B illustrates the condition where the clock signal CLK provides a negative going transition while the pseudo CMOS circuit 110 is in the evaluation mode. Also from the prior discussion, it should be recalled that under the condition of the timing diagram of FIG. 4B the clock enable signal CE will have been latched low pursuant to the positive going transition of the precharge/evaluation complete signal PECOMP, and the precharge/evaluation control signal PECTRL will have been latched high pursuant to the same positive going transition of the precharge/evaluation complete signal PECOMP. The transistors 19, 31, 41 are on, and therefore the negative going transition of the clock signal CLK does not affect the states of the clock enable signal CE and the precharge/evaluation control signal PECTRL. Thus, the timing circuit functions properly for the condition illustrated in timing diagram of FIG. 4B, and the precharge/evaluation complete signal PECTRL does not provide a negative going transition pursuant to a positive going transition of the clock signal CLK until after the precharge/evaluation complete signal PECOMP has provided a negative going transition.

The timing diagram of FIG. 4C schematically illustrates the condition where the negative going transition of the clock signal CLK occurs after the pseudo CMOS circuit 110 has completed evaluation. From the prior discussion, it should be appreciated that the precharge/evaluation control signal PECTRL will be high as a result of the positive going transition of the precharge/evaluation complete signal PECOMP and will remain high until the next positive going transition of the clock signal CLK.

From the foregoing discussion relative to FIGS. 4A through 4C, it should be appreciated that the timing circuit 10 remains independent of the duty cycle of the clock signal CLK. The alternative negative going transitions of the clock signal CLK schematically illustrated in FIG. 3 represents that the timing circuit 10 remains independent of the duty cycle of the clock signal CLK.

As mentioned previously, the timing circuit 10 is self-initializing. More particularly, the timing circuit 10 provides initialization of itself and the pseudo CMOS circuit 110 being clocked. If the precharge/evaluation control signal PECTRL starts out high (defining the evaluation phase), the pseudo CMOS circuit 110 will force the precharge/evaluation complete signal PECOMP low (indicating that evaluation is complete). As a result, the precharge latch circuit 40 latches the precharge/evaluation control signal PECTRL high via the transistors 33, 41, assuming the clock signal CLK starts out low. This state is the correct initial state for the timing circuit 10.

If the timing circuit 10 starts out in the incorrect state, the precharge/evaluation control signal PECTRL starts out low (indicating the precharge phase), which forces the pseudo CMOS circuit 110 to provide a high precharge/evaluation complete signal PECOMP (indicating that precharging is complete). As a result, the precharge/evaluation control signal PECTRL is pulled high via the transistor 25. The high state of the precharge/evaluation control signal PECTRL causes the pseudo CMOS circuit 110 to provide a low precharge/evaluation complete signal PECOMP (indicating that evaluation is complete). The precharge/evaluation control signal PECTRL is then latched high via the transistors 33, 41 while the clock signal CLK is low, thereby returning the timing circuit 10 to the correct initial state.

The foregoing has been a disclosure of a timing circuit which provides advantages for the utilization of pseudo CMOS circuits, including the following. The timing circuit provides for precharge and evaluation clock phases which are not fixed relative to each other, but rather depend on the operational speed capabilities of the pseudo CMOS circuity being clocked. As a result, the operational capabilities of the particular pseudo CMOS circuit may be fully utilized. Further, the attendant complexity of implementing four clock phases having fixed phase relationships is avoided. Additionally, the extensive circuit simulations necessary for prior pseudo CMOS clocking techniques are also avoided. Still further, the disclosed timing circuit is strictly edge triggered by the input clock signal and does not constrain the duty cycle or frequency of the input clock signal.

While the disclosed embodiment has been discussed relative to pseudo CMOS circuits, the invention is readily utilized with other circuits such as NMOS and discrete circuits where optimization of operational speeds is desired.

Although the foregoing has been a description and illustration of specific embodiments of the invention, various modifications and changes thereto can be made by persons skilled in the art without departing from the scope and spirit of the invention as defined by the following claims.

What is claimed is:

1. A timing circuit for use with an external circuit that provides a precharge/evaluation complete signal indicative of precharge completion and evaluation completion, the timing circuit being responsive to a clock signal and the precharge/evaluation complete signal provided by the external circuit, and comprising:
   clock enabling means responsive to the clock signal and the precharge/evaluation complete signal for providing a clock enable signal having first and second levels respectively indicative of (a) a predetermined condition wherein evaluation has been completed and the clock signal is at a predetermined level, and (b) precharge completion;
   level shifting means responsive to the clock signal and said clock enable signal for providing a phase control signal to the external circuit, said phase control signal defining (a) a precharge phase in response to said clock enable signal indicating said predetermined condition and the clock signal providing a predetermined transition, and (b) an evaluation phase in response to the precharge/evaluation complete signal indicating completion of precharging; and
   latching means responsive to said clock enable signal and the clock signal for selectively latching said phase control signal in its respective phases.

2. The timing circuit of claim 1 wherein said clock enabling means includes means for transitioning said clock enable signal to said secon means level solely in response to the precharge/evaluation complete signal indicating precharge completion.

3. The timing circuit of claim 1 wherein said clock enabling means includes means for transitioning said clock enable signal to said first level when the precharge/evaluation complete signal indicates evaluation completion and the clock signal is at said predetermined level.

4. The timing circuit of claim 1 wherein said clock enabling means includes means for latching said clock enable signal in said first and second levels.

5. The timing circuit of claim 1 wherein said level shifting means includes means for causing said phase control signal to transition to said precharge phase directly in response to said predetermined clock transition when said clock enable signal is in said first state indicative of said predetermined condition.

6. The timing circuit of claim 1 wherein said level shifting means includes means for causing said phase control signal to transition to said evaluation phase solely in response to said clock enable signal transitioning to said second state indicative of precharge completion.

7. The timing circuit of claim 1 further including other latching means for providing respective data input and output latch signals in response to the start of said precharge phase defined by said phase control signal and in response to the precharge/evaluation complete signal indicating completion of evaluation.

8. A timing circuit responsive to a clock input signal and a feedback signal from an external circuit for providing to the external circuit multiple-phase clock signals derived from the clock input signal, and which optimizes the operating speed of the external circuit, the timing circuit comprising:
   driving means responsive to the clock input signal and the feedback signal for providing an output signal to the external circuit, said output signal comprising (a) a precharge phase timing signal when said clock input signal transitions to a predetermined level and (b) an evaluation phase timing signal when said feedback signal transitions to a predetermined level; and
   latching means responsive to said feedback signal and said output signal for providing input latch and output latch timing signals to said external circuit for respectively indicating that inputs and outputs of the external circuit are valid.

9. The timing circuit of claim 8 further comprising latching means responsive to the clock input signal and said clock enable signal for latching said output signal in a predefined level, so that said output signal does not float.

* * * * *